(12) United States Patent
Chen et al.

(10) Patent No.: US 11,923,272 B2
(45) Date of Patent: Mar. 5, 2024

(54) INTEGRATED ASSEMBLIES AND METHODS OF FORMING INTEGRATED ASSEMBLIES

(71) Applicant: Micron Technology, Inc., Boise, ID (US)

(72) Inventors: Zhuo Chen, Boise, ID (US); Irina V. Vasilyeva, Boise, ID (US); Darwin Franseda Fan, Boise, ID (US); Kamal Kumar Muthukrishnan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 104 days.

(21) Appl. No.: 17/721,919

(22) Filed: Apr. 15, 2022

(65) Prior Publication Data

US 2022/0238417 A1 Jul. 28, 2022

Related U.S. Application Data

(62) Division of application No. 17/021,793, filed on Sep. 15, 2020, now Pat. No. 11,335,626.

(51) Int. Cl.
| | |
|---|---|
| *H01L 21/48* | (2006.01) |
| *H01L 23/48* | (2006.01) |
| *H10B 12/00* | (2023.01) |
| *H10B 53/10* | (2023.01) |
| *H10B 53/30* | (2023.01) |
| *H10B 53/40* | (2023.01) |

(52) U.S. Cl.
CPC ........ *H01L 23/481* (2013.01); *H01L 21/4814* (2013.01); *H10B 12/0335* (2023.02); *H10B 12/315* (2023.02); *H10B 12/50* (2023.02); *H10B 53/10* (2023.02); *H10B 53/30* (2023.02); *H10B 53/40* (2023.02)

(58) Field of Classification Search
None
See application file for complete search history.

(56) References Cited

U.S. PATENT DOCUMENTS

| | | | |
|---|---|---|---|
| 5,084,406 A | 1/1992 | Rhodes | |
| 7,459,362 B2 | 12/2008 | Juengling | |
| 2012/0007165 A1 | 1/2012 | Lee | |
| 2015/0303250 A1 | 10/2015 | Ishikawa | |
| 2021/0210491 A1* | 7/2021 | Servalli | H10B 12/0335 |
| 2022/0068934 A1* | 3/2022 | Yang | H10B 12/0335 |
| 2022/0238417 A1* | 7/2022 | Chen | H10B 53/10 |

* cited by examiner

*Primary Examiner* — Steven M Christopher
(74) *Attorney, Agent, or Firm* — Wells St. John P.S.

(57) ABSTRACT

Some embodiments include a method of forming an integrated assembly. Semiconductor material is patterned into a configuration which includes a set of first upwardly-projecting structures spaced from one another by first gaps, and a second upwardly-projecting structure spaced from the set by a second gap. The second gap is larger than the first gaps. Conductive material is formed along the first and second upwardly-projecting structures and within the first and second gaps. First and second segments of protective material are formed over regions of the conductive material within the second gap, and then an etch is utilized to pattern the conductive material into first conductive structures within the first gaps and into second conductive structures within the second gap. Some embodiments include integrated assemblies.

14 Claims, 19 Drawing Sheets

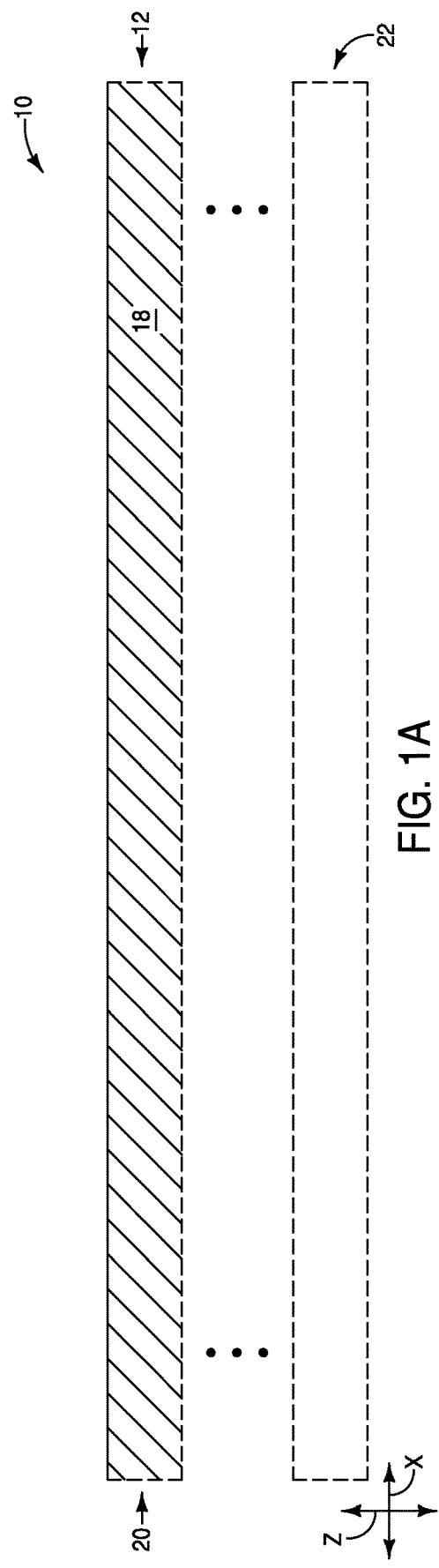

INTEGRATED ASSEMBLIES AND METHODS OF FORMING INTEGRATED ASSEMBLIES

RELATED PATENT DATA

This patent resulted from divisional application of U.S. patent application Ser. No. 17/021,793, filed Sep. 15, 2020, the disclosures of which are incorporated herein by reference.

TECHNICAL FIELD

Integrated assemblies (e.g., integrated memory). Methods of forming integrated assemblies.

BACKGROUND

Memory may utilize memory cells which individually comprise an access device (e.g., an access transistor) in combination with a storage element (e.g., a capacitor, a resistive memory device, a phase change memory device, etc.).

In some applications it is desired to form conductive interconnects which pass through a tier of memory architecture. Difficulties are encountered in forming such conductive interconnects while also maintaining integrity of structural components of the memory architecture (e.g., while also maintaining integrity of wordlines). It would be desirable to develop improved methods for fabricating memory architecture and improved methods of forming conductive interconnects passing through a tier of the memory architecture.

BRIEF DESCRIPTION OF THE DRAWINGS

FIGS. 1A and 1B are diagrammatic cross-sectional side views along the lines A-A and B-B, respectively, of FIG. 1.

FIG. 2A is a diagrammatic cross-sectional side view along the line A-A of FIG. 2.

FIG. 3A is a diagrammatic cross-sectional side view along the line A-A of FIG. 3.

FIG. 4A is a diagrammatic cross-sectional side view along the line A-A of FIG. 4.

FIG. 5A is a diagrammatic cross-sectional side view along the line A-A of FIG. 5.

FIG. 6A is a diagrammatic cross-sectional side view along the line A-A of FIG. 6.

FIG. 7A is a diagrammatic cross-sectional side view along the line A-A of FIG. 7.

FIG. 8A is a diagrammatic cross-sectional side view along the line A-A of FIG. 8.

DETAILED DESCRIPTION OF THE ILLUSTRATED EMBODIMENTS

Some embodiments include methods of forming integrated assemblies. Protective material (e.g., silicon dioxide, aluminum oxide, hafnium oxide, etc.) may be utilized to protect segments of conductive material within wide gaps during an etch so that such segments remain as conductive lines (e.g., wordlines) in a finished architecture. Some embodiments include integrated assemblies in which conductive lines (e.g., wordlines) in wide gaps have different cross-sectional shapes than analogous conductive lines within narrow gaps. Example embodiments are described with reference to FIGS. 1-9.

Figure 1:
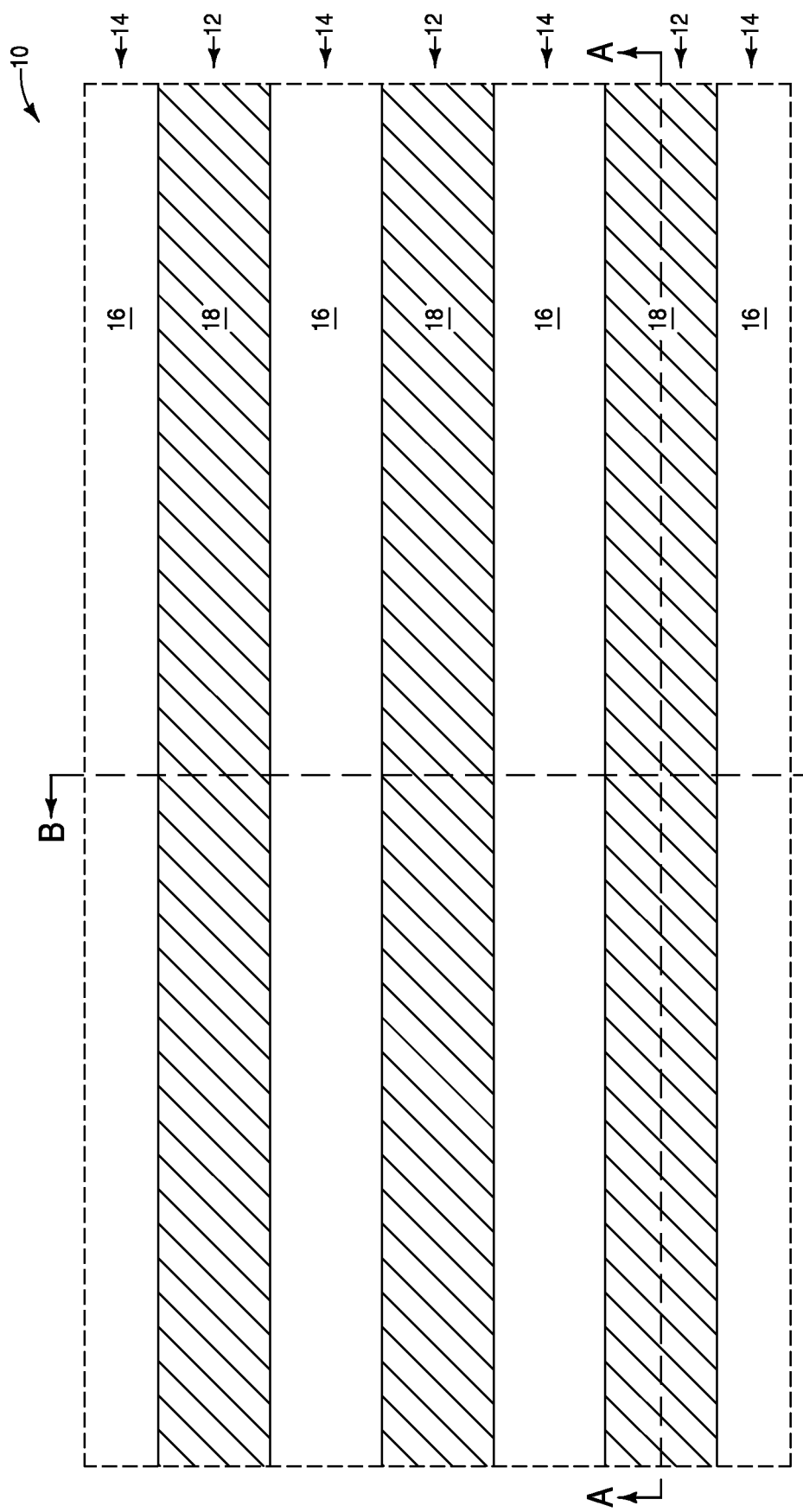
FIG. 1 is a diagrammatic top-down view of a region of an example integrated assembly at an example process stage of an example method.
Figure 1B:
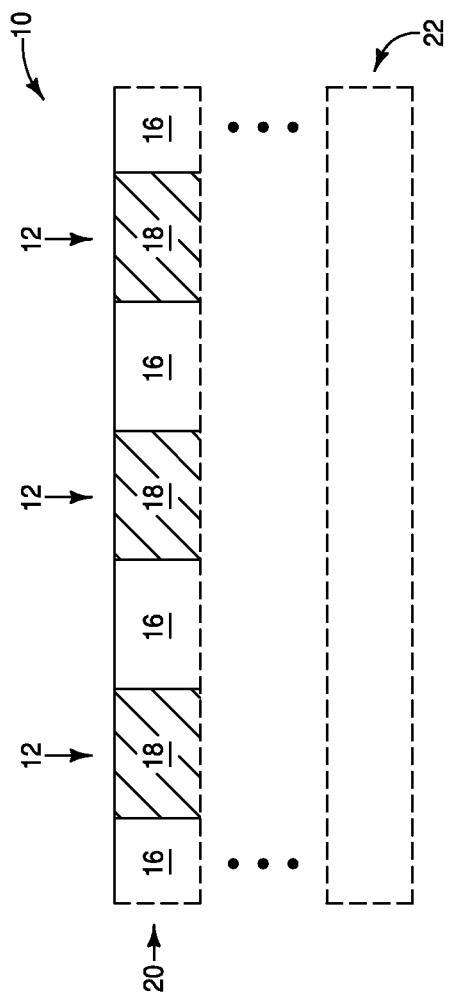

Referring to FIGS. 1-1B, an integrated assembly 10 includes a series of conductive lines 12 which extend along a first direction (an illustrated x-axis direction). The lines 12 are illustrated to be straight, but in other embodiments may be curved, wavy, etc.

The conductive lines 12 are spaced from one another by intervening regions 14 which comprise insulative material 16. The insulative material 16 may comprise any suitable composition(s); and in some example embodiments may comprise, consist essentially of, or consist of silicon dioxide.

The conductive lines 12 comprise conductive material 18. The conductive material 18 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The conductive lines 12 and the insulative material 16 may be considered to be comprised by a first tier (level) 20, with such tier being supported over a semiconductor base 22 (as shown in FIGS. 1A and 1B). The semiconductor base 22 may comprise semiconductor material; and may, for example, comprise, consist essentially of, or consist of monocrystalline silicon. The base 22 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 22 may correspond to a semiconductor substrate containing one or more materials associated with integrated circuit fabrication. Such materials may include, for example, one or more of refractory metal materials, barrier materials, diffusion materials, insulator materials, etc.

The tier 20 is shown to be vertically offset relative to the base 22, and specifically is shown to be offset from the base 22 along an illustrated z-axis direction.

A gap is provided between the tier 20 and the base 22 to indicate that other materials and structures may be provided between the tier 20 and the base 22. In some embodiments, circuitry (e.g., logic circuitry, such as, for example, CMOS) may be provided along the base 22. One or more conductive interconnects may eventually be formed to extend through the tier 20 to the circuitry associated with the base 22.

The conductive lines 12 may be referred to as first conductive lines, and may be considered to be configured as a first series of the first conductive lines.

Figure 2:
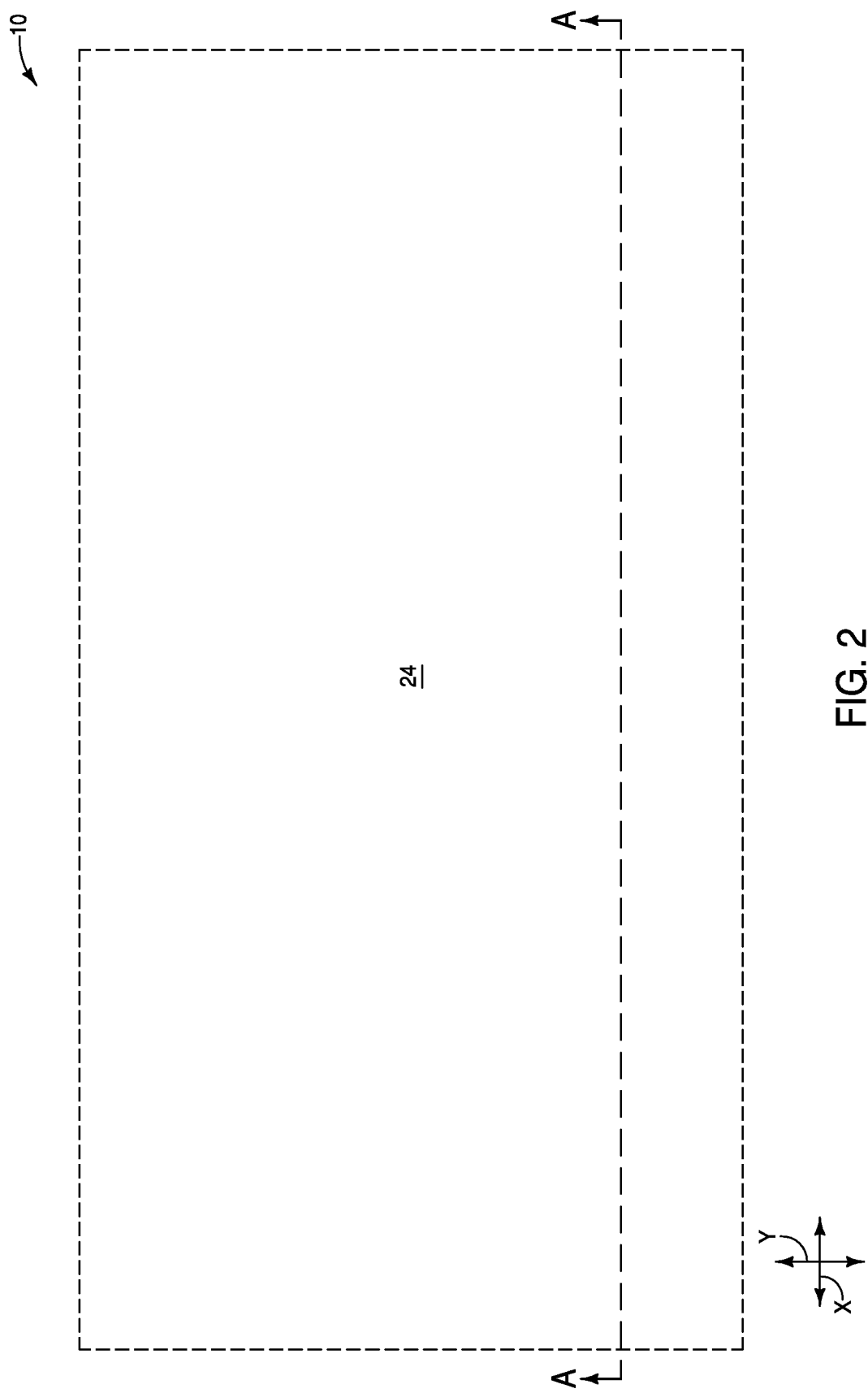
FIGS. 2 and 2A are a diagrammatic top-down view and a diagrammatic cross-sectional side view, respectively, of the region of the example integrated assembly of FIGS. 1 and 1A at an example process stage subsequent to that of FIGS. 1 and 1A.
Figure 2A:
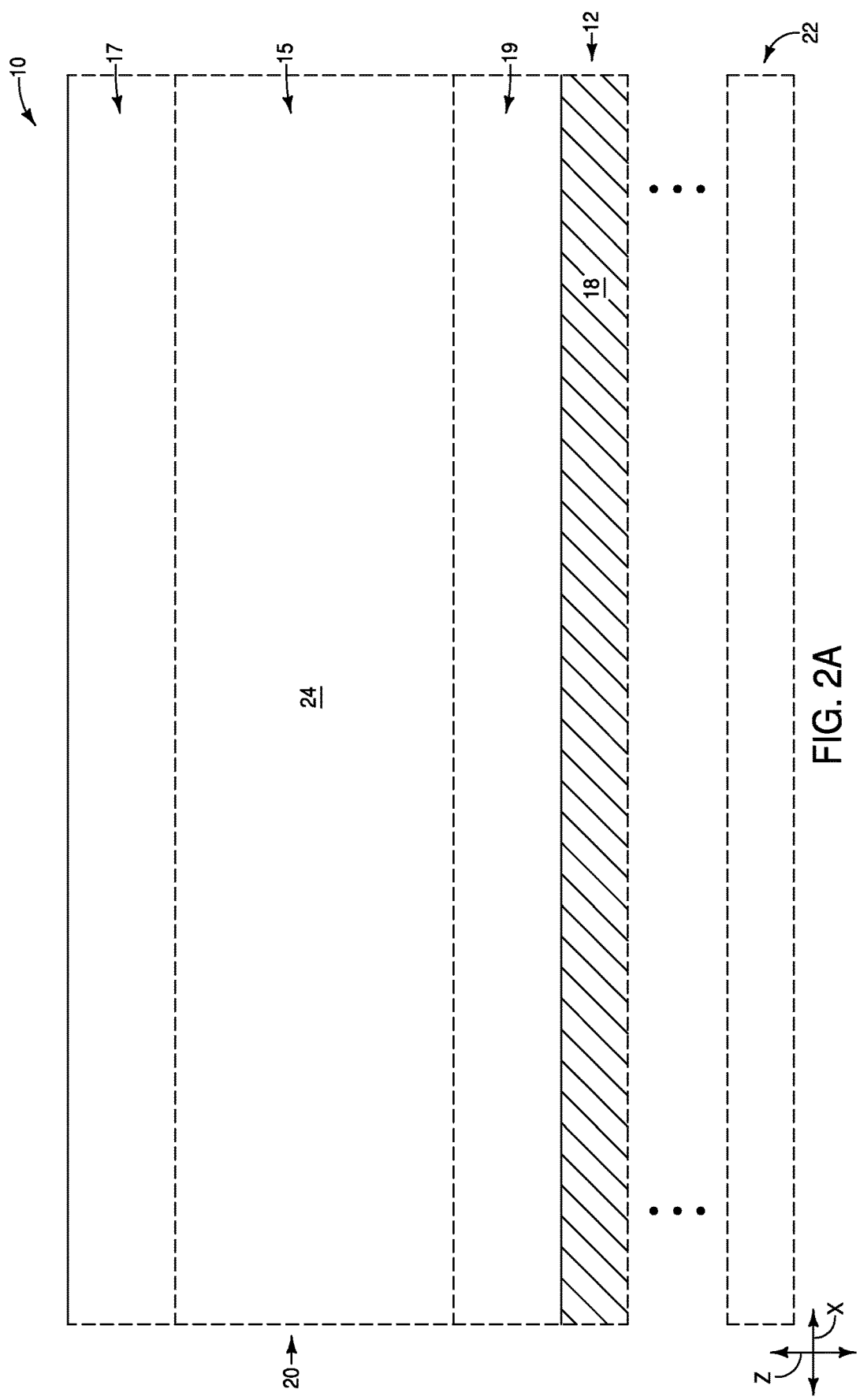

Referring to FIGS. 2 and 2A, semiconductor material 24 is formed over the first series of the first conductive lines 12. The semiconductor material 24 may comprise any suitable composition(s); and in some embodiments may comprise, consist essentially of, or consist of one or more of silicon, germanium, III/V semiconductor material (e.g., gallium phosphide), semiconductor oxide (e.g., InGaZnO, where the chemical formula indicates primary constituents rather than a specific stoichiometry), etc.; with the term III/V semiconductor material referring to semiconductor materials comprising elements selected from groups III and V of the periodic table (with groups III and V being old nomenclature, and now being referred to as groups 13 and 15). In some example embodiments, the semiconductor material 24 may comprise, consist essentially of, or consist of silicon. The silicon may be in any suitable crystalline form (e.g., monocrystalline, amorphous, polycrystalline, etc.).

The semiconductor material 24 may include regions 15, 17 and 19. The regions 17 and 19 may be conductively doped to eventually become source/drain regions of access devices (transistors), and the region 15 may be appropriately doped to become channel regions of the access devices. Dashed lines are provided to illustrate approximate boundaries between the regions 15, 17 and 19.

Figure 3:
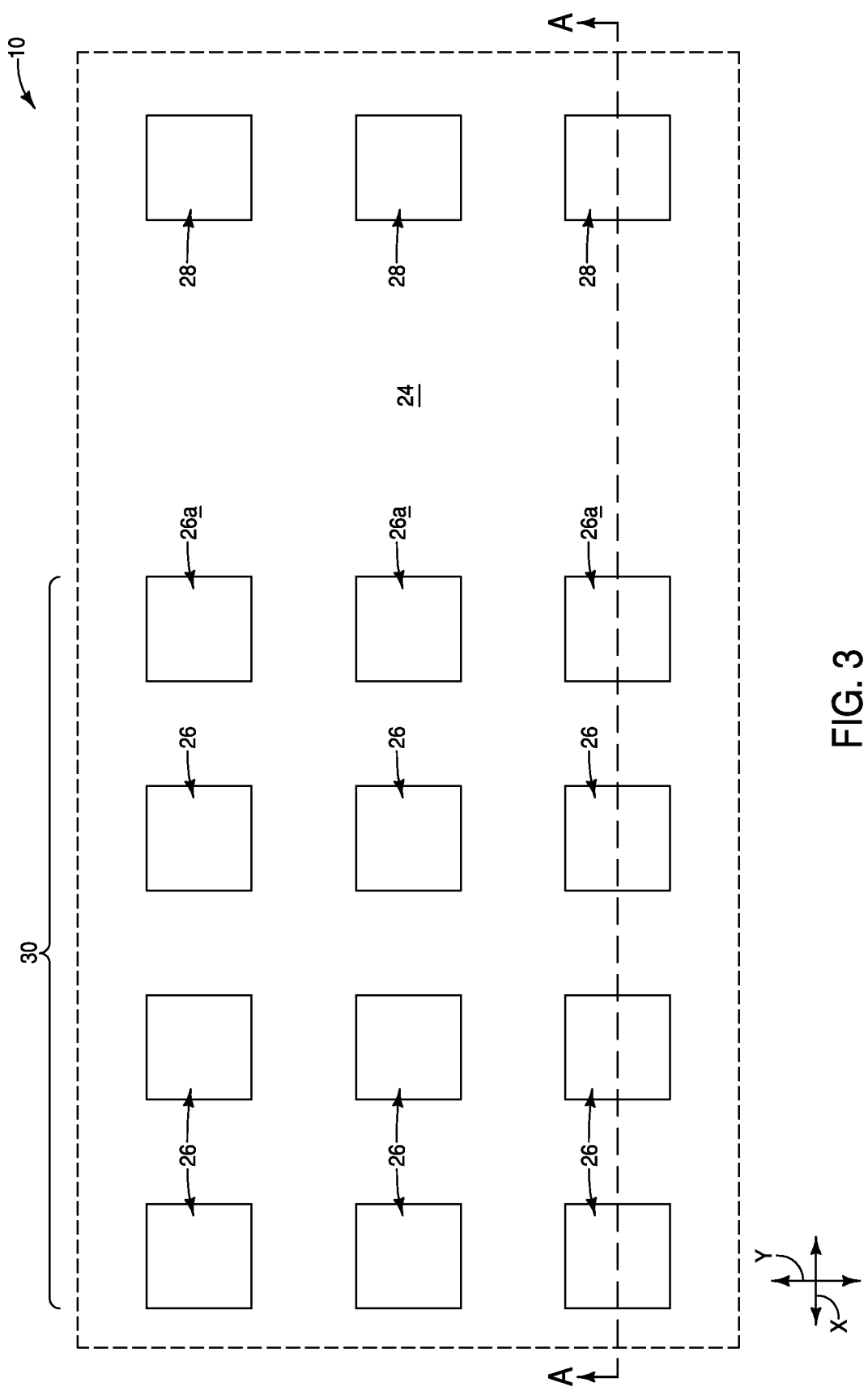
FIGS. 3 and 3A are a diagrammatic top-down view and a diagrammatic cross-sectional side view, respectively, of the region of the example integrated assembly of FIGS. 1 and 1A at an example process stage subsequent to that of FIGS. 2 and 2A.
Figure 3A:
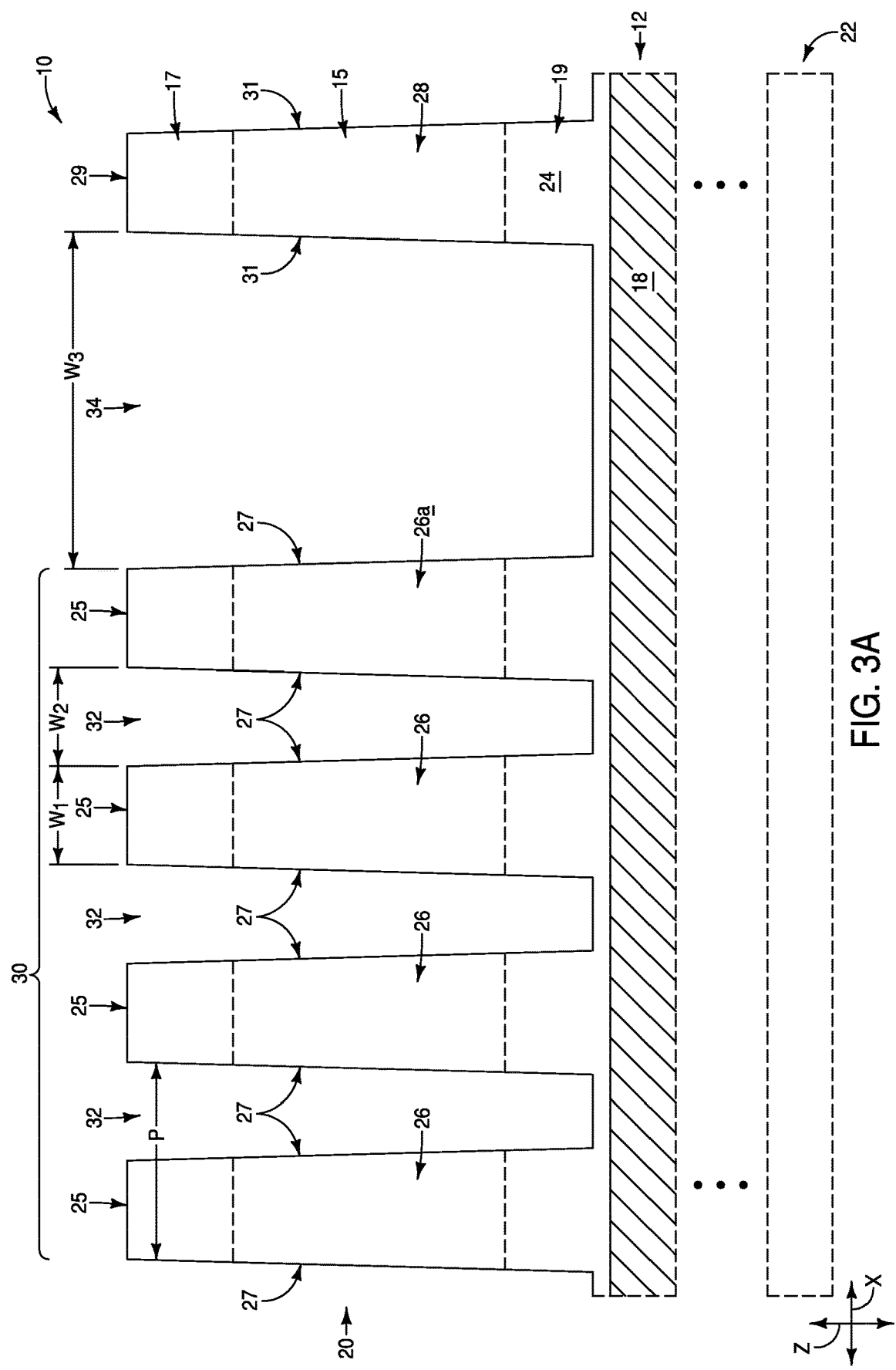

Referring to FIGS. 3 and 3A, the semiconductor material 24 is patterned into a configuration which includes upwardly-projecting structures (features) 26 and 28. The upwardly-projecting structures 26 and 28 may be alternatively referred to as pillars, posts, etc.

The upwardly-projecting structures 26 may be referred to as first upwardly-projecting structures, and together form a set 30. The upwardly-projecting structures 28 may be referred to as second upwardly-projecting structures. The upwardly-projecting structures 26 and 28 are aligned with the conductive lines 12. One of such conductive lines 12 is shown in the cross-section of FIG. 3A, and the upwardly-projecting structures 26 and 28 directly over such conductive line are also shown in FIG. 3A.

The first upwardly-projecting structures 26 are spaced from one another by first gaps 32. The upwardly-projecting features 26 may be on a pitch P which is within a range of from about 30 nanometers (nm) to about 60 nm. In some embodiments, the upper surfaces of the structures 26 may have widths $W_1$ along the cross-section of FIG. 3A which are within a range of from about 15 nm to about 30 nm, and upper regions of the gaps 32 may have widths $W_2$ which are within a range of from about 15 nm to about 30 nm.

The second upwardly-projecting structure 28 along the cross-section of FIG. 3A is spaced from the set 30 of the first upwardly-projecting structures 26 by a second gap 34. The second gap 34 has a width $W_3$ along the cross-section of FIG. 3A. The width $W_3$ of the second gap is larger than the widths $W_2$ of the first gaps, and in some embodiments may be at least about twice as large as the widths of the first gaps, at least about three times as large as the widths of the first gaps, at least about four times as large as the widths of the first gaps, etc.

In the shown embodiment of FIG. 3A, one of the first upwardly-projecting structures 26 is adjacent to the second gap 34. Such upwardly-projecting structure may be referred to as an edge upwardly-projecting structure of the set 30, and is labeled as 26a so that it may be distinguished from the other upwardly-projecting structures 26.

The structures 26 have sidewall surfaces 27 and top surfaces 25, and the structures 28 have sidewall surfaces 31 and top surfaces 29. In the illustrated embodiment, the sidewall surfaces (sidewalls) 27 and 31 are tapered along the vertical (z-axis) direction. In other embodiments, the sidewalls may be vertically straight rather than being tapered.

In the shown embodiment, the semiconductor material 24 remains over the conductive line 12 within the gaps 32 and 34. In other embodiments, the semiconductor material 24 may be entirely removed from within the wide gap 34 and/or from within the narrow gaps 32.

Figure 4:
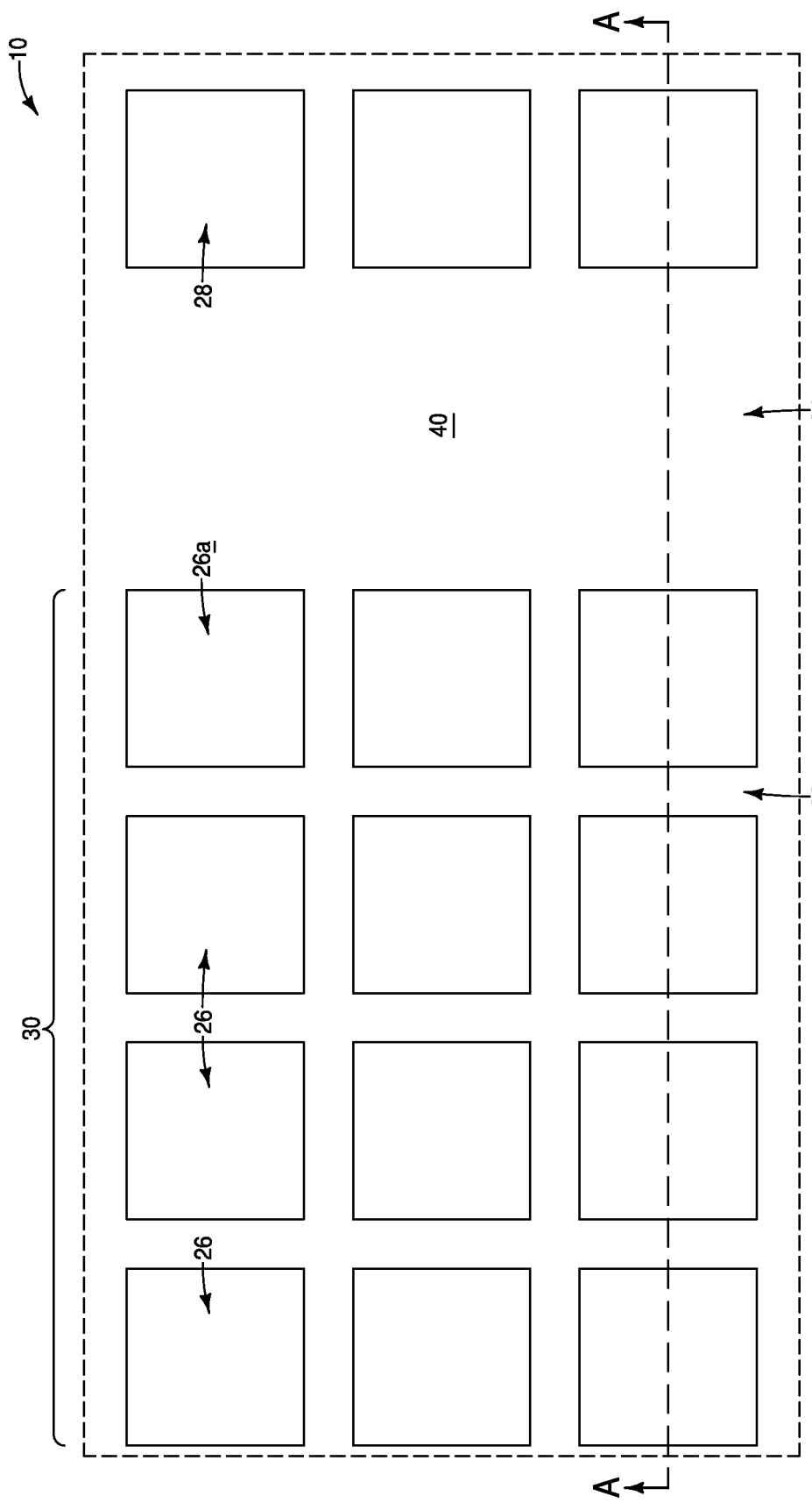
FIGS. 4 and 4A are a diagrammatic top-down view and a diagrammatic cross-sectional side view, respectively, of the region of the example integrated assembly of FIGS. 1 and 1A at an example process stage subsequent to that of FIGS. 3 and 3A.
Figure 4A:
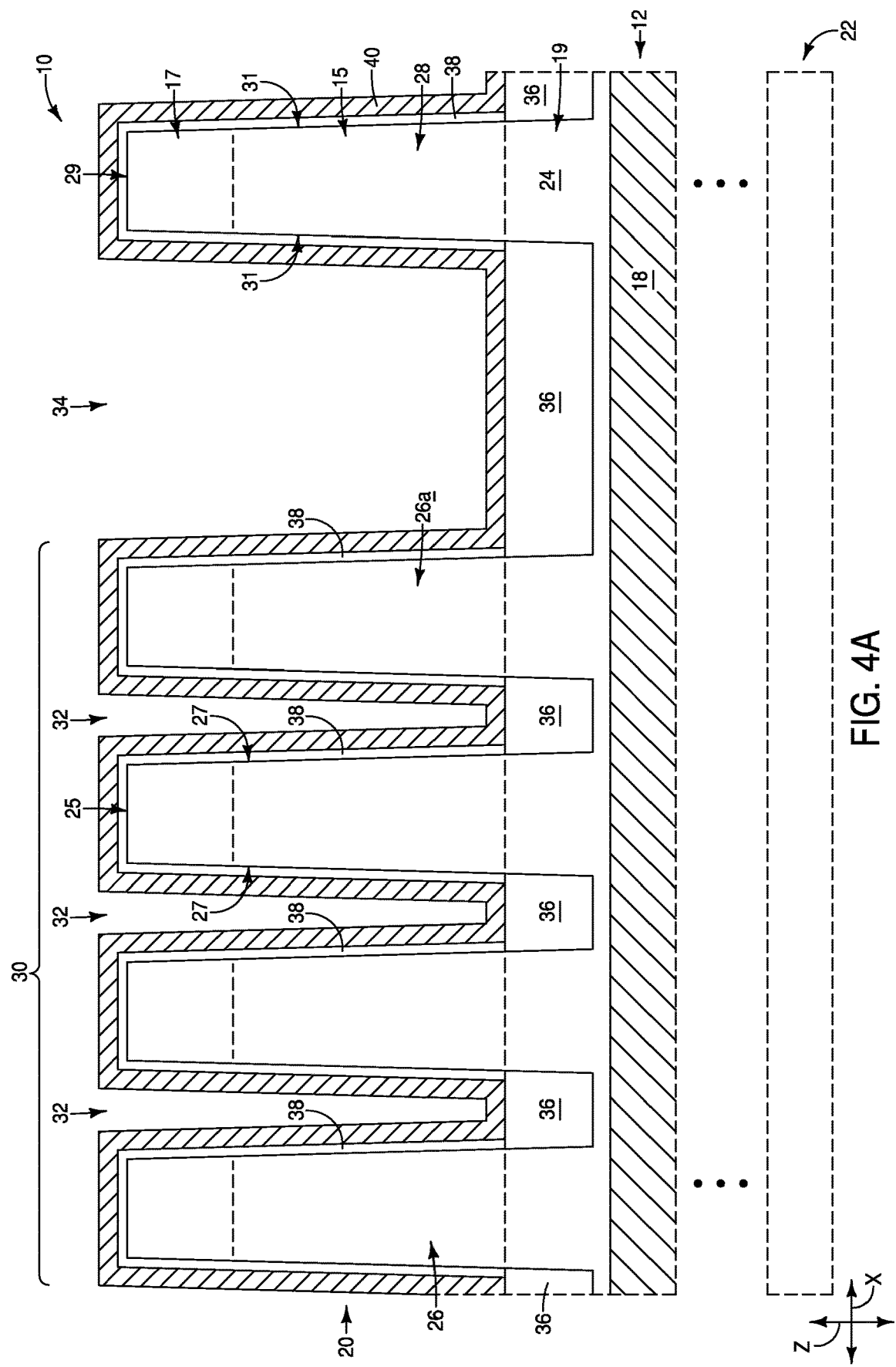

Referring to FIGS. 4 and 4A, insulative material 36 is provided along the bottoms of the gaps 32 and 34. The insulative material 36 may be provided to any suitable thickness. The insulative material 36 offsets bottoms of transistor gates (formed at a later process stage) relative to bottoms of the upwardly-projecting structures 26 and 28, and in some embodiments may be formed to a thickness approximately equal to the thickness of the lower source/drain regions 19 (as shown). The insulative material 36 may comprise any suitable composition(s); and in some example embodiments may comprise, consist essentially of, or consist of silicon dioxide.

Dielectric material 38 is formed along the surfaces 25, 27, 29 and 31 of the upwardly-projecting structures 26 and 28. The dielectric material 38 may be formed subsequent to the formation of the insulative material 36 (as shown) so that the dielectric material 38 is not along lower portions of the upwardly-projecting structures 26 and 28. Alternatively, the dielectric material 38 may be formed prior to formation of the insulative material 36, and may extend along lower portions of the structures 26 and 28.

The dielectric material 38 may comprise any suitable composition(s). In some embodiments, the dielectric material 38 may be formed by oxidizing the semiconductor material 24. Accordingly, if the semiconductor material 24 comprises, consists essentially of, or consists of silicon, then the dielectric material 38 may comprise, consist essentially of, or consist of silicon dioxide. Alternatively, at least some of the dielectric material 38 may be formed by deposition (e.g., atomic layer deposition, chemical vapor deposition, etc.). In such embodiments, the dielectric material 38 may comprise, for example, one or more of aluminum oxide, hafnium oxide, zirconium oxide, etc., either in addition to, or alternatively to, silicon dioxide.

The dielectric material 38 may be formed to any suitable thickness, and in some embodiments may be formed to a thickness within a range of from about 15 angstroms (Å) to about 50 Å.

Conductive material 40 is formed over the dielectric material 38; and in the shown embodiment is formed over the first and second upwardly-projecting structures 26 and 28, and within the first and second gaps 32 and 34. The conductive material 40 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 40 may comprise, consist essentially of, or consist of one or more metals (e.g., titanium, tungsten, etc.) and/or metal-containing compositions (e.g., titanium silicide, titanium carbide, titanium nitride, titanium boride, tungsten silicide, tungsten carbide, tungsten nitride, tungsten boride, etc.).

The conductive material 40 be formed to any suitable thickness, and in some embodiments may be formed to a thickness within a range of from about 20 Å to about 100 Å.

Figure 5:
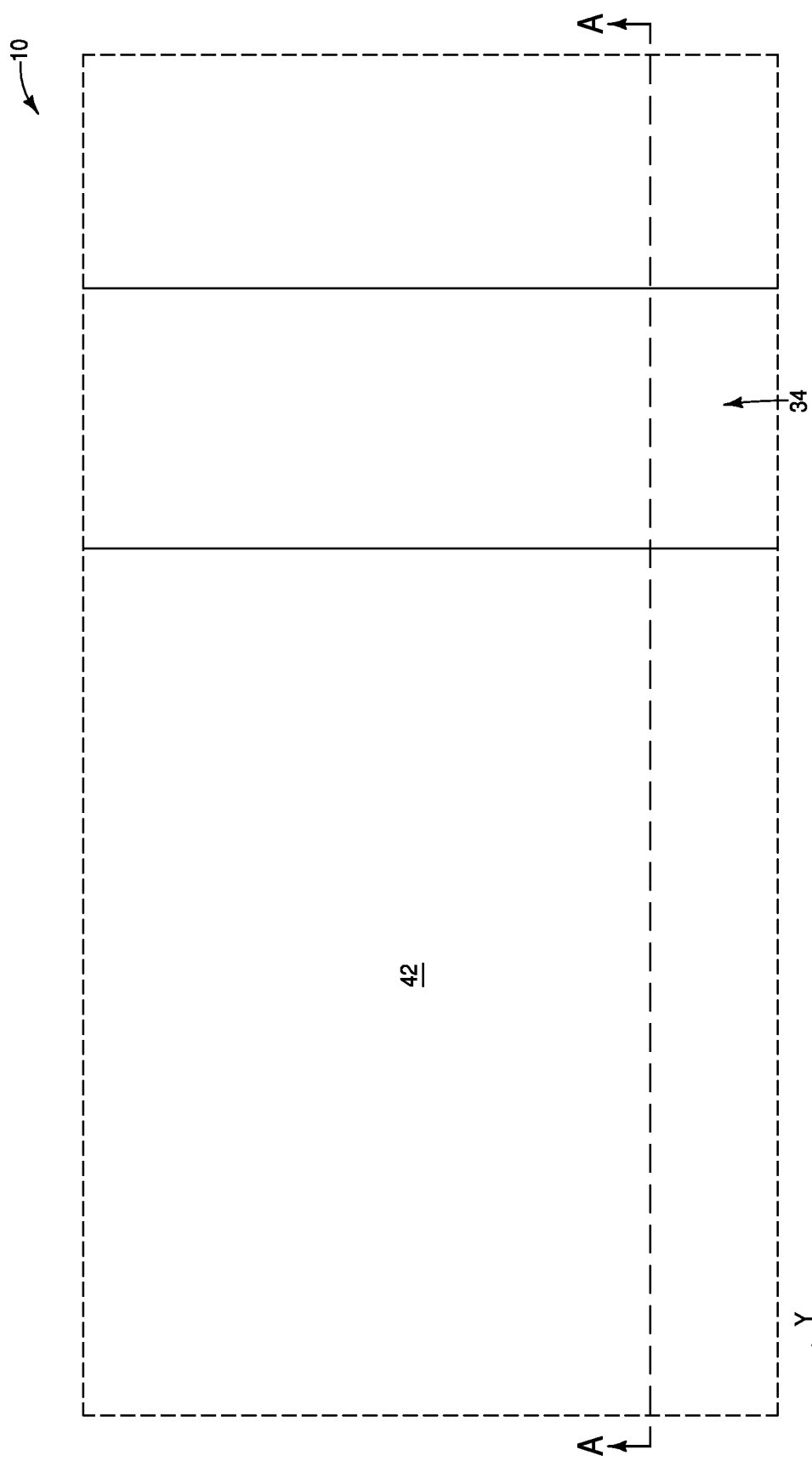
FIGS. 5 and 5A are a diagrammatic top-down view and a diagrammatic cross-sectional side view, respectively, of the region of the example integrated assembly of FIGS. 1 and 1A at an example process stage subsequent to that of FIGS. 4 and 4A.
Figure 5A:
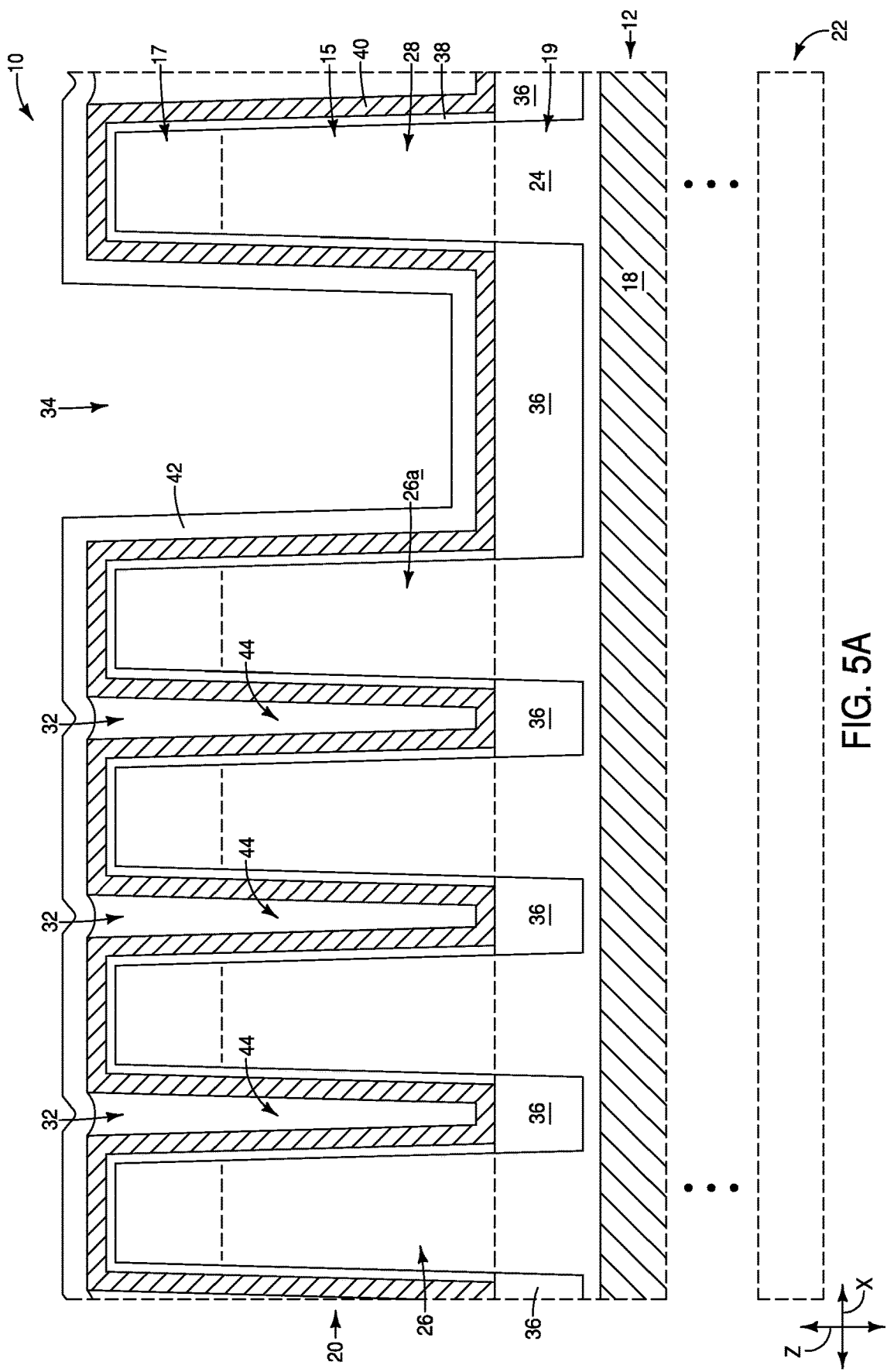

Referring to FIGS. 5 and 5A, protective material 42 is formed across the first gaps 32 and within the second gap 34. Notably, the protective material 42 does not fill the first gaps 32, but instead pinches off across the first gaps to leave voids 44 within the first gaps 32. The protective material 42 does, however, extend into the second gap 34, and in the shown embodiment extends conformally along the conductive material 40 within the second gap 34.

The protective material 42 may be formed to any suitable thickness to establish the illustrated configuration in which the material pinches off across the narrow gaps 32, while extending conformally (or at least substantially conformally) along the conductive material 40 within the second gap 34. The term "at least substantially conformally" means conformally to within reasonable tolerances of fabrication and measurement. In some embodiments, the protective material 42 may be formed to a thickness within a range of from about 50 nm to about 100 nm.

The protective material 42 may comprise any suitable composition(s). In some embodiments, the protective material 42 may comprise, consist essentially of, or consist of one or more of silicon dioxide and/or various high-k compositions. The term high-k means a dielectric constant greater than that of silicon dioxide (i.e., greater than about 3.9). Example high-k compositions include silicon nitride, aluminum oxide, hafnium oxide, zirconium oxide, etc. The protective material 42 may be electrically insulative in some embodiments. Alternatively, the protective material 42 may be conductive or semiconductive.

Figure 6:
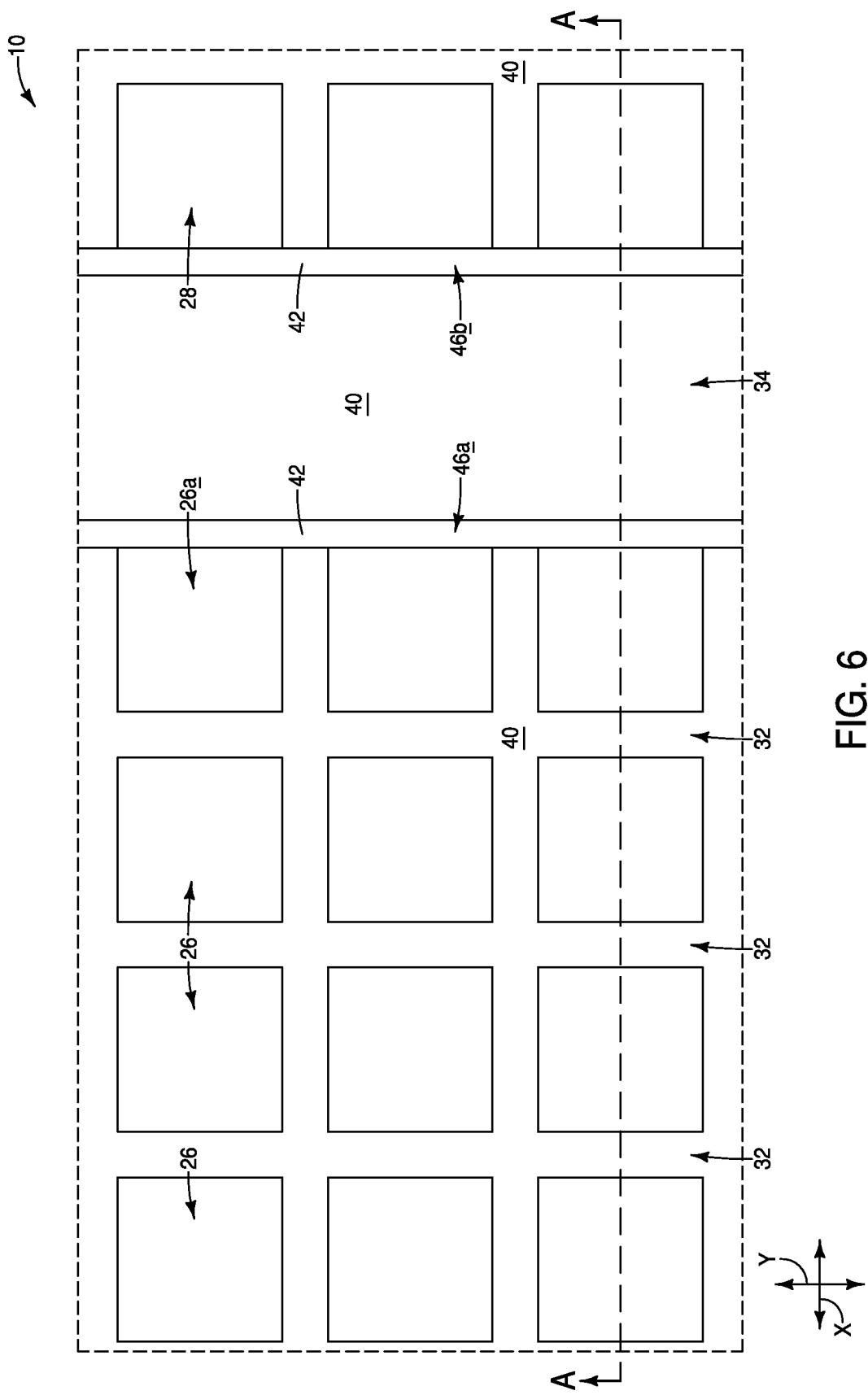
FIGS. 6 and 6A are a diagrammatic top-down view and a diagrammatic cross-sectional side view, respectively, of the region of the example integrated assembly of FIGS. 1 and 1A at an example process stage subsequent to that of FIGS. 5 and 5A.
Figure 6A:
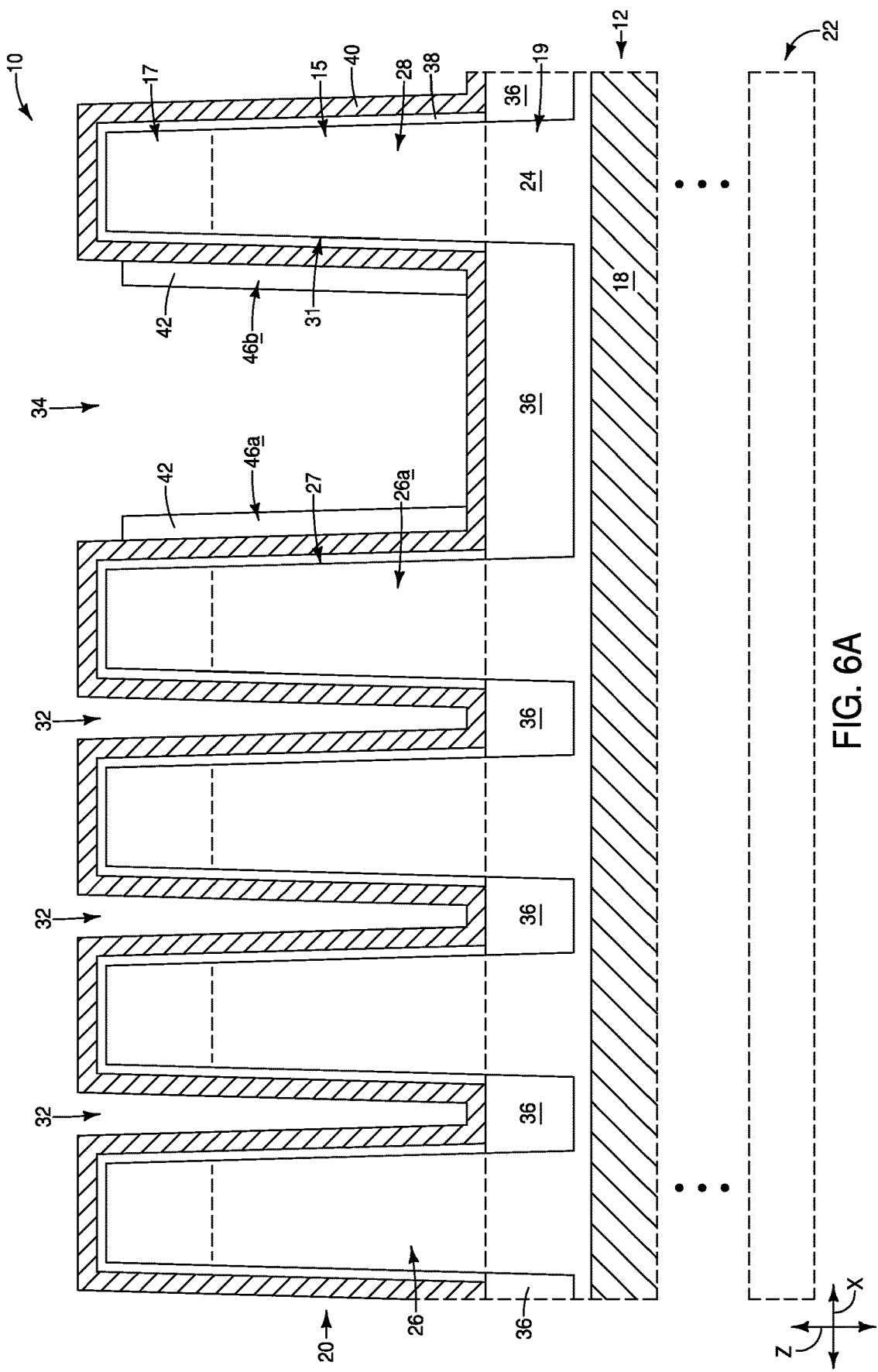

Referring to FIGS. 6 and 6A, the protective material 42 is removed from over the first and second upwardly-projecting structures 26 and 28 while leaving segments 46 of the protective material over the conductive material 40 within the wide gap (second gap) 34. The segments 46 may be considered to include a first segment 46a adjacent a sidewall (or sidewall surface) 27 of the edge upwardly-projecting structure 26a, and a second segment 46b adjacent a sidewall (or sidewall surface) 31 of the second upwardly-projecting structure 28.

Figure 7:
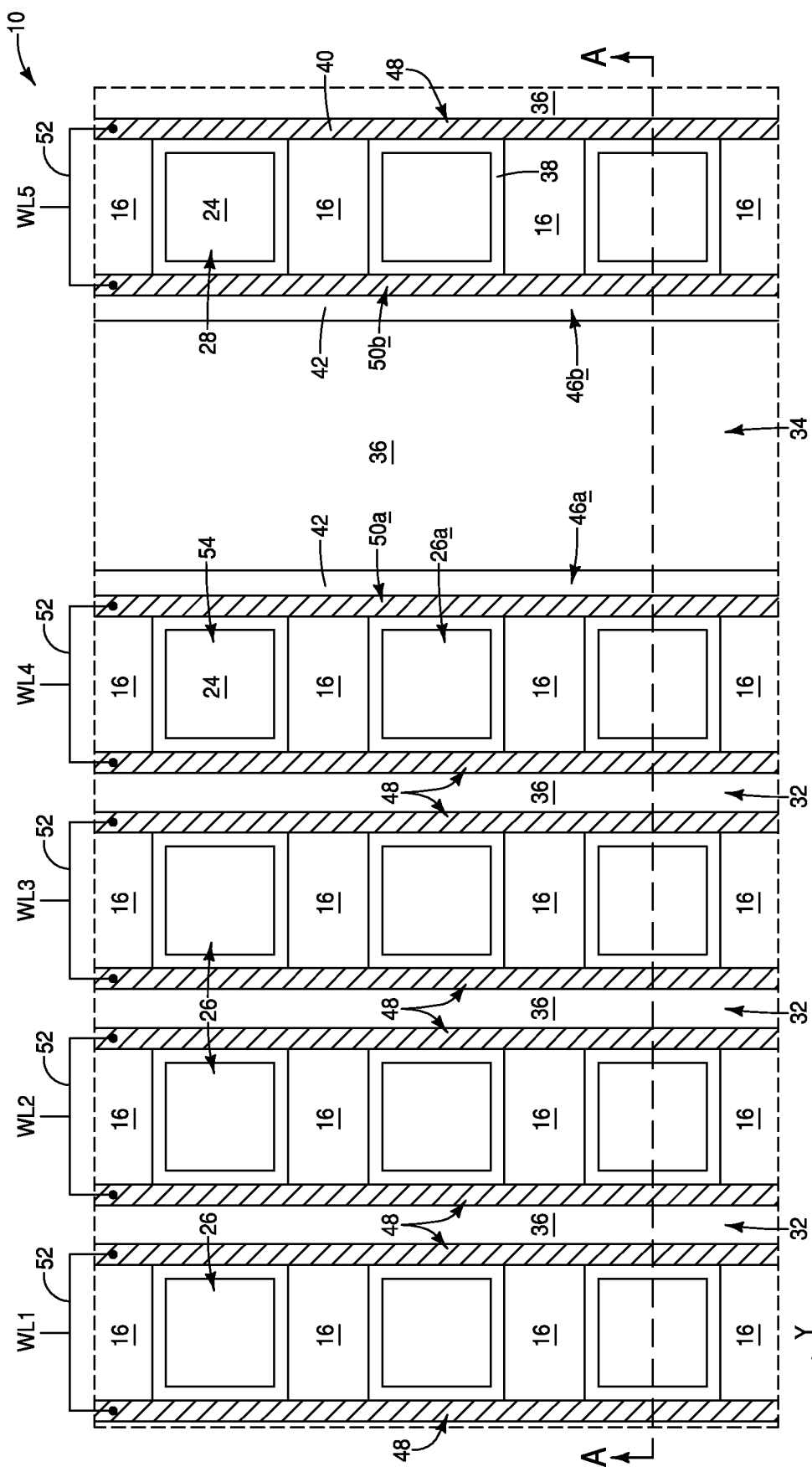
FIGS. 7 and 7A are a diagrammatic top-down view and a diagrammatic cross-sectional side view, respectively, of the region of the example integrated assembly of FIGS. 1 and 1A at an example process stage subsequent to that of FIGS. 6 and 6A.
Figure 7A:
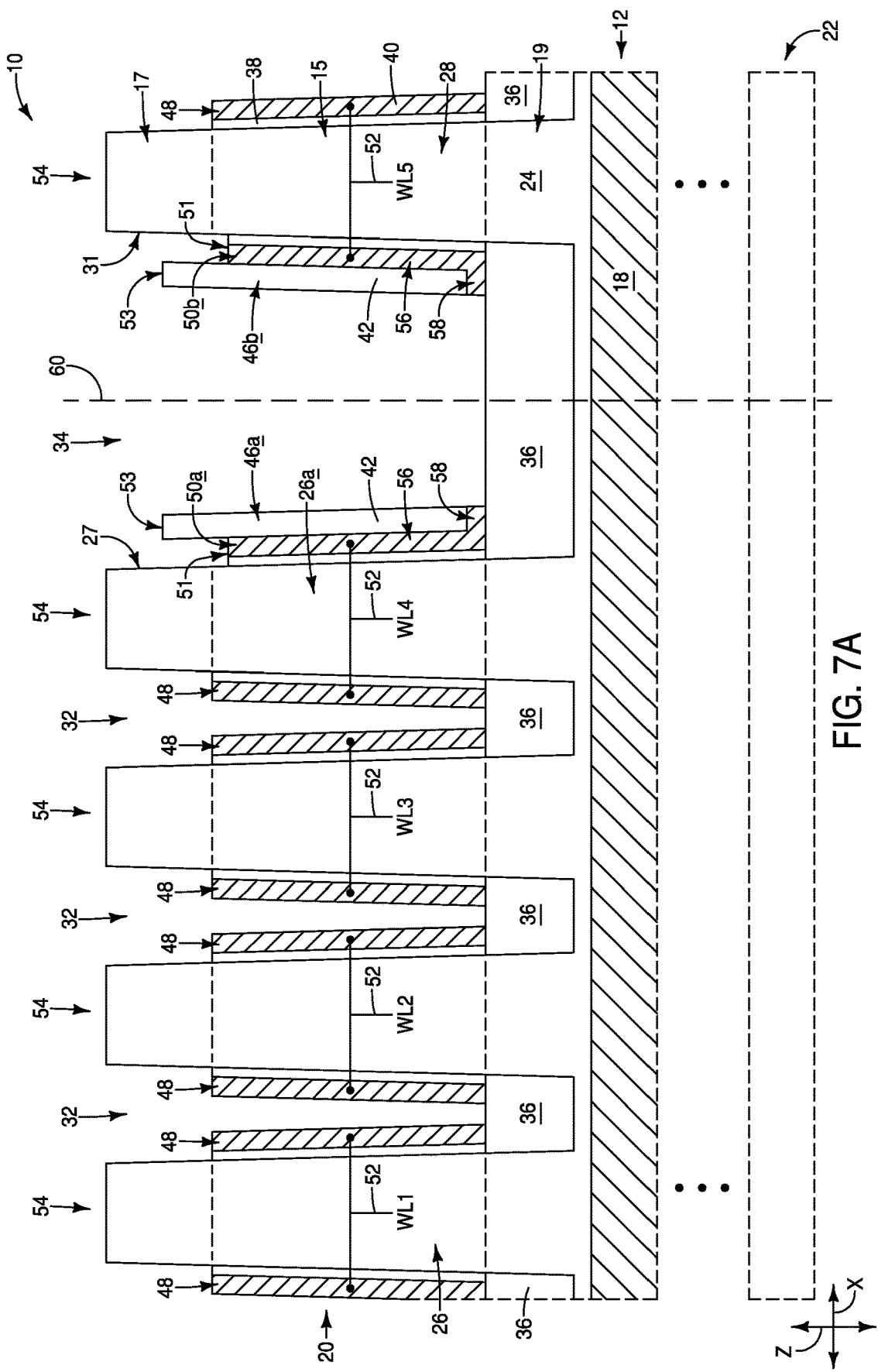

Referring to FIGS. 7 and 7A, one or more suitable etches are utilized to pattern the conductive material 40 into first conductive structures 48 within the first gaps 32, and into second conductive structures 50 within the second gap 34. The segments 46a and 46b of the protective material 42 are utilized to protect regions of the conductive material 40 within the second gap 34 so that such regions are not lost during the etching of the conductive material 40. In contrast, conventional processing lacking the protective material 42 may lose the entirety, or nearly the entirety, of the conductive material 40 from within the second gap 34 which problematically loses, or substantially entirely loses, conductive structures analogous to the illustrated conductive structures 50. Accordingly, the protective material 42 may advantageously enable the conductive structures 50 to be formed to a suitable size and configuration for maintaining integrity of devices fabricated within the tier 20 of the integrated assembly 10.

In the shown embodiment, the conductive structures 48 and 50 are incorporated into wordlines 52 (WL1-WL5), with the wide gap 34 being between the wordlines WL4 and WL5. The pillars (upwardly-extending structures) 26 and 28 are incorporated into active regions of access devices (transistors) 54. Each of the transistors includes a channel region 15 vertically disposed between a lower source/drain region 19 and an upper source/drain region 17. The source/drain regions 17 and 19 are gatedly coupled to one another through the channel region 28. Specifically, an appropriate voltage (i.e., a voltage above a threshold voltage) on a wordline 52 may induce electrical fields on the channel regions proximate such wordline to cause electrical coupling between the source/drain regions on opposing sides of the channel regions.

The second conductive structures 50 are shaped differently than the first conductive structures 48 along the cross-section of FIG. 7A. Specifically, the first conductive structures 48 are shown to be substantially straight structures (with the term "substantially straight" meaning straight to within reasonable tolerances of fabrication and measurement), and the conductive structures 50 are shown to be angle plates. The conductive structure 50 adjacent the sidewall 27 of the edge pillar 26a is labeled as 50a, and the conductive structure 50 adjacent the sidewall 31 of the pillar 28 is labeled as 50b. The conductive structures 50a and 50b may be referred to as first and second angle plates, respectively.

Each of the angle plates 50a and 50b includes a primary portion 56, and a secondary portion 58 extending into the gap 34 from the primary portion 56. In some embodiments, secondary portions 58 may be considered to be configured as ledges. The ledge 58 of the conductive structure 50a may be referred to as a first ledge, and the ledge 58 of the second conductive structure 50b may be referred to as a second ledge. The remaining portions of the protective material 42 are supported by the ledges 58. During the etching of the conductive material 40, the protective material 42 protects the ledges 58 and thus defines the lengths of the ledges. In some embodiments the protective material 42 may be thinned during the etching utilized to pattern the conductive material 40 which may reduce the lengths of the ledges 58 as compared to illustrated embodiment in which the protective material 42 is not thinned.

In the shown embodiment, a height of the conductive material 40 is reduced relative to a height of the protective material 42 during the patterning of the conductive material 40. Accordingly, the angle plates 50a and 50b have upper surfaces 51 which are vertically offset relative to upper surfaces 53 of the segments 46a and 46b of the protective material 42.

The first and second angle plates 50a and 50b may be substantially mirror images of one another across a vertical plane 60 centrally located between the first and second angle plates, as shown. In other embodiments (not shown), the first and second angle plates may not be substantially mirror images of one another. The term "substantial mirror image" means a mirror image to within reasonable tolerances of fabrication and measurement.

Figure 8:
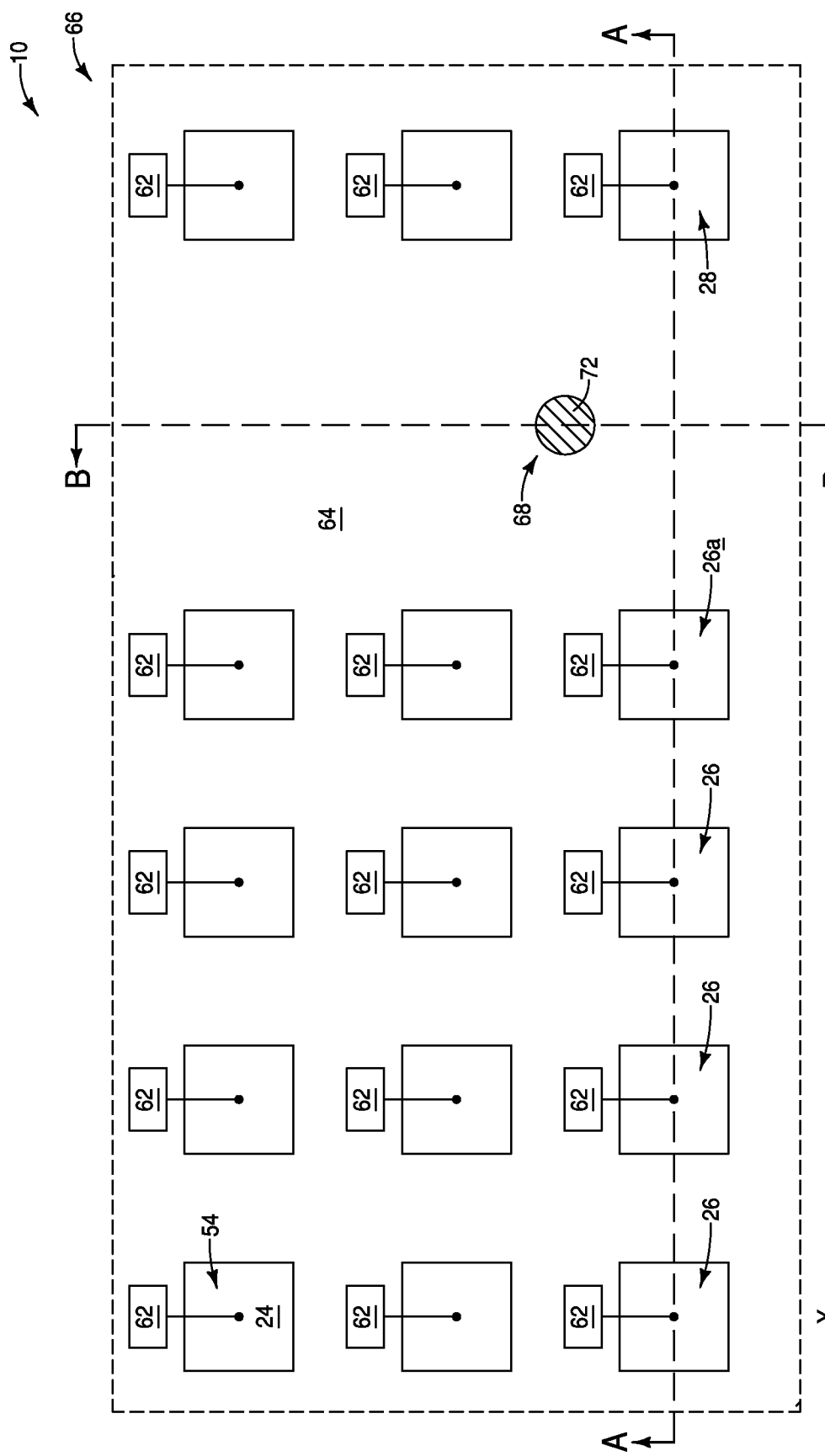
FIGS. 8 and 8A are a diagrammatic top-down view and a diagrammatic cross-sectional side view, respectively, of the region of the example integrated assembly of FIGS. 1 and 1A at an example process stage subsequent to that of FIGS. 7 and 7A.
Figure 8A:
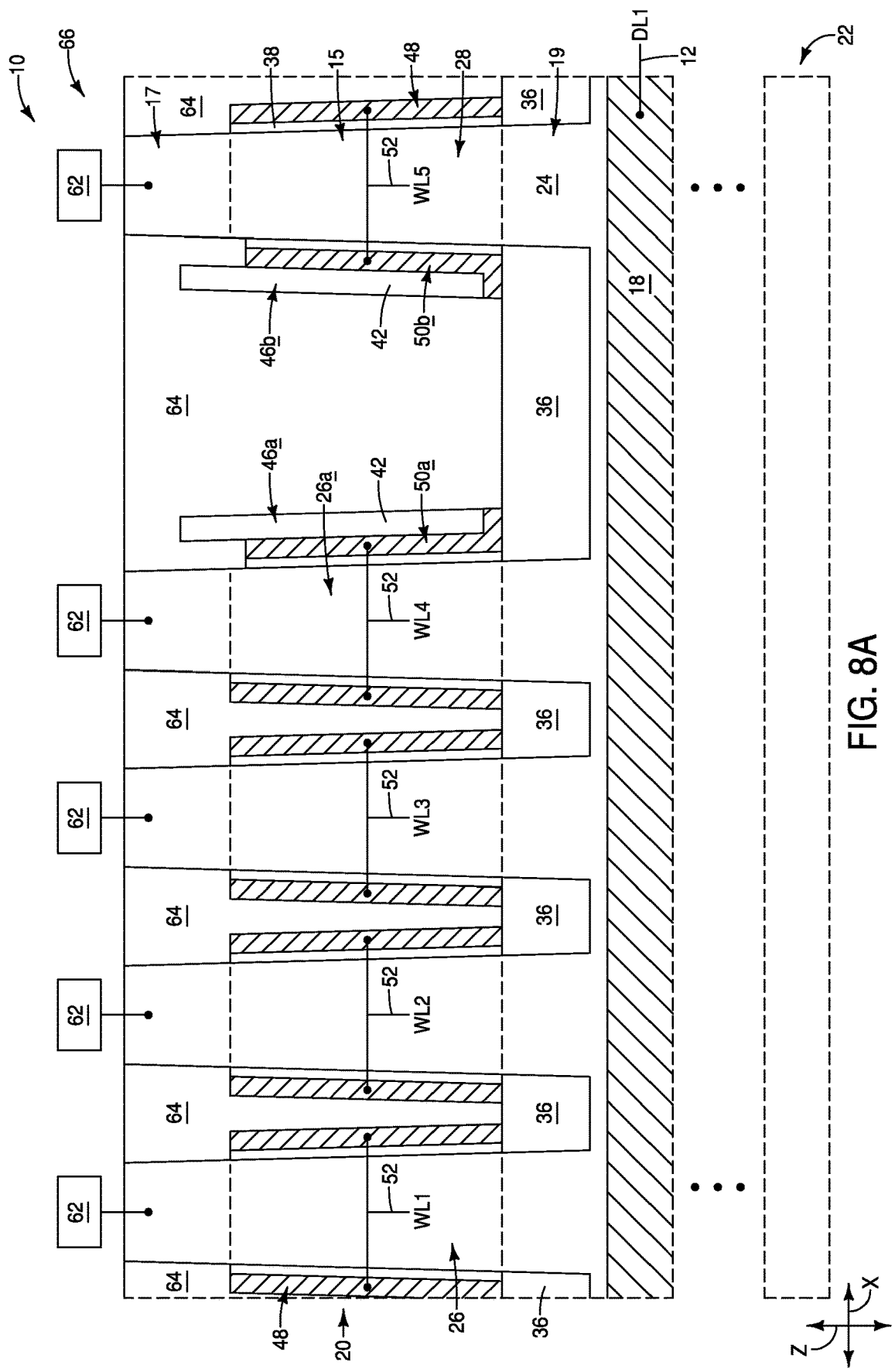
Figure 8B:
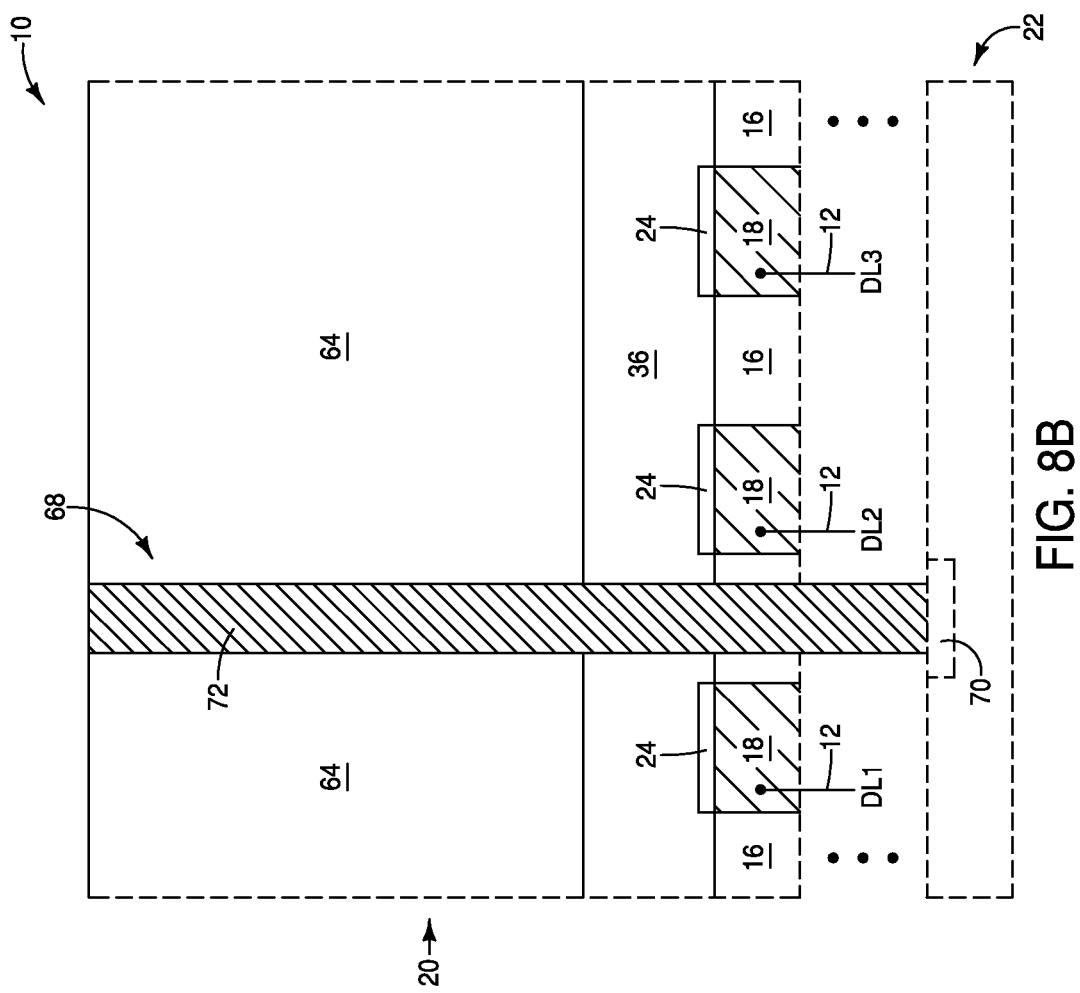
FIG. 8B is a diagrammatic cross-sectional side view along the line B-B of FIG. 8.

Referring to FIGS. 8-8B, storage elements 62 are formed over the pillars 26 and 28, and are electrically coupled with the upper source/drain regions 17. The storage-elements 62 may be any suitable devices having at least two detectable states; and in some embodiments may be, for example, capacitors, resistive-memory devices, conductive-bridging devices, phase-change-memory (PCM) devices, programmable metallization cells (PMCs), etc. If the storage elements are capacitors, they may be either ferroelectric capacitors (i.e., may comprise ferroelectric insulative material between a pair of capacitor electrodes) or may be non-ferroelectric capacitors (i.e., may comprise only non-ferroelectric insulative material between a pair of capacitor electrodes). Example ferroelectric insulative materials may include one or more of transition metal oxide, zirconium, zirconium oxide, niobium, niobium oxide, hafnium, hafnium oxide, lead zirconium titanate, and barium strontium titanate. Example non-ferroelectric insulative materials may comprise, consist essentially of, or consist of silicon dioxide.

In some embodiments, the storage elements 62 over the pillars 26 may be referred to as first storage elements, and the storage elements 62 over the pillars 28 may be referred to as second storage elements.

Insulative material 64 is formed within the gaps 32 and 34 (FIGS. 7 and 7A). In some embodiments, the protective material 42 may be considered to correspond to a first insulative material, and the insulative material 64 may be considered to correspond to a second insulative material. The first insulative material 42 is not within the first gaps 32, and the second insulative material 64 is within both the first gaps 32 and the second gap 34 (with the gaps 32 and 34 being shown in FIGS. 7 and 7A). The first and second insulative materials 42 and 64 may comprise different compositions relative to one another. For instance, the first insulative material 42 may comprise one or more high-k dielectric compositions, while the second insulative material 64 may comprise, consist essentially of, or consist of silicon dioxide. In other embodiments, the materials 42 and 64 may be compositionally the same as one another, and may merge together at the processing stage of FIGS. 8-8B. Additionally, the material 36 may be compositionally the same as one or both of the materials 42 and 64, or may be compositionally different from both of the materials 42 and 64.

Although the protective material 42 is shown remaining in the final structure of FIGS. 8-8B, it is to be understood that in other embodiments the protective material 42 may be removed after the patterning of the conductive structures 50a and 50b.

The storage elements 62 and access devices (transistors) 54 may be incorporated into a memory array 66. Accordingly, the tier 20 may be referred to as a memory tier.

In the illustrated embodiment, a conductive interconnect 68 is formed to extend through the memory tier 20 and to circuitry 70 associated with the base 22. The circuitry 70 may be logic circuitry (e.g., CMOS) in some applications.

The conductive interconnect 68 is formed within the wide gap 34 (labeled in FIGS. 7 and 7A). The wide gap may simplify formation of the interconnect 68 as compared to forming an analogous interconnect within a narrower gap. The interconnect 68 may have any suitable shape, and may or may not correspond to the illustrated cylindrical pillar. The interconnect 68 may comprise any suitable conductive material 72. For instance, the conductive material 72 may comprise one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The conductive interconnect 68 may be located between the first and second angle plates 50a and 50b as can be understood by comparing the top view of FIG. 8 (in which the interconnect 68 is shown, but in which the angle plates 50a and 50b are not visible) with the top view of FIG. 7 (which shows the angle plates 50a and 50b).

Figure 9:
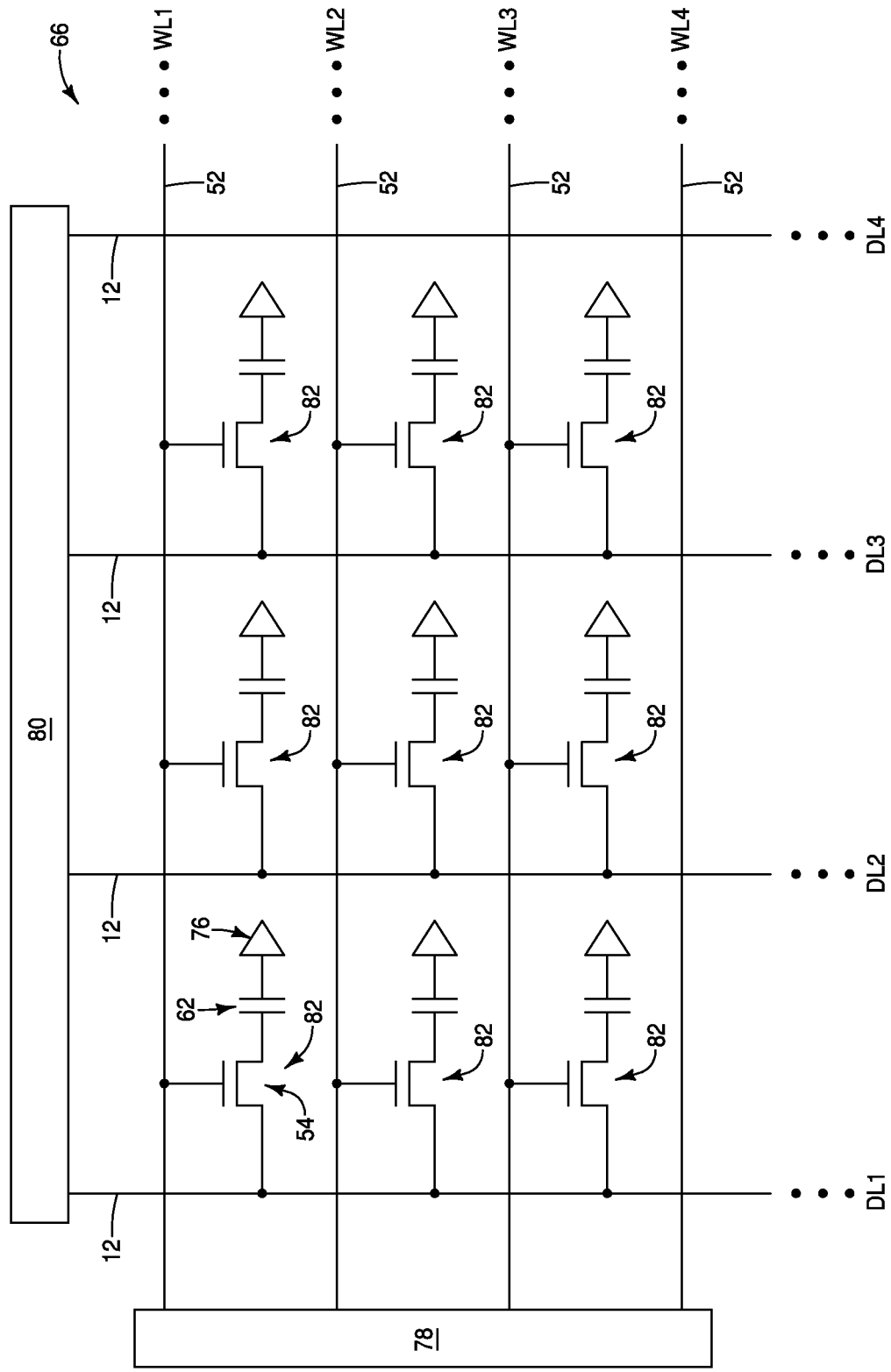
FIG. 9 is a diagrammatic schematic view of a region of an example memory array.

The memory array 66 may have any suitable configuration. FIG. 9 shows an example configuration in which the storage elements 62 are capacitors. The capacitors may be non-ferroelectric capacitors, and accordingly the memory array 66 may be a dynamic random access memory (DRAM) array. Alternatively, the capacitors may be ferroelectric capacitors, and accordingly the memory array 66 may be a ferroelectric random access memory (FeRAM) array.

The illustrated capacitors 62 each have an electrical node coupled with an access transistor 54, and each have another electrical node coupled with a reference 76. The reference 76 may correspond to any suitable reference voltage, including, ground, VCC/2, etc.

The wordlines 52 are shown coupled with wordline-driver-circuitry 78, and the digit lines 12 are shown coupled with sense-amplifier-circuitry 80. The access transistors 54 and storage elements 62 together form memory cells 82, with each of the memory cells being uniquely addressed by one of the digit lines 12 in combination with one of the wordlines 52.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multi-chip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a set of first upwardly-projecting structures spaced from one another by first gaps. One of the first upwardly-projecting structures is an edge upwardly-projecting structure of the set. A second upwardly-projecting structure is spaced from the set of the first upwardly-projecting structures by a second gap which is larger than the first gaps. First conductive structures are within the first gaps and adjacent sidewalls of the first projecting structures. Second conductive structures are within the second gap. One of the second conductive structures is adjacent a sidewall of the edge upwardly-projecting structure and another of the second conductive structures is adjacent a sidewall of the second upwardly-projecting structure. The second conductive structures are shaped differently than the first conductive structures along the cross-section.

Some embodiments include a method of forming an integrated assembly. Semiconductor material is patterned into a configuration which includes, along a cross-section, a set of first upwardly-projecting structures spaced from one another by first gaps and a second upwardly-projecting structure spaced from the set by a second gap. One of the first upwardly-projecting structures is an edge upwardly-projecting structure of the set and is adjacent the second gap. The second gap is larger than the first gaps. Conductive material is formed along the first and second upwardly-projecting structures and within the first and second gaps. Protective material is formed across the first gaps and within the second gap. The protective material is removed from over the first and second upwardly-projecting structures while leaving segments of the protective material over the conductive material within the second gap. One of the segments of the protective material is a first segment and is adjacent a sidewall of the edge upwardly-projecting structure, and one of the segments of the protective material is a second segment and is adjacent a sidewall of the second upwardly-projecting structure. An etch is utilized to pattern the conductive material into first conductive structures within the first gaps and into second conductive structures within the second gap. One of the second conductive structures is adjacent the sidewall of the edge upwardly-projecting structure and is protected by the first segment of the protective material during the etch. Another of the second conductive structures is adjacent the sidewall of the second upwardly-projecting structure and is protected by the second segment of the protective material during the etch.

Some embodiments include a method of forming an integrated assembly. A semiconductor material is formed over a first series of first conductive lines. The semiconductor material is patterned into a configuration which includes, along a cross-section, a set of first upwardly-projecting structures over one of the first conductive lines and spaced from one another by first gaps and a second upwardly-projecting structure over said one of the first conductive lines and spaced from the set by a second gap. One of the first upwardly-projecting structures is an edge upwardly-projecting structure of the set and is adjacent the second gap. The second gap is larger than the first gaps. Conductive material is formed along the first and second upwardly-projecting structures and within the first and second gaps. Protective material is formed across the first gaps and within the second gap. The protective material is removed from over the first and second upwardly-projecting structures while leaving segments of the protective material over the conductive material within the second gap. One of the segments of the protective material is a first segment and is adjacent a sidewall of the edge upwardly-projecting structure, and one of the segments of the protective material is a second segment and is adjacent a sidewall of the second upwardly-projecting structure. An etch is utilized to pattern the conductive material into a second series of second conductive lines. The second series includes a first set of the second conductive lines within the first gaps, and a second set of the second conductive lines within the second gap. One of the second conductive lines of the second set is adjacent the sidewall of the edge upwardly-projecting structure and is protected by the first segment of the protective material during the etch. Another of the second conductive lines of the second set is adjacent the sidewall of the second upwardly-projecting structure and is protected by the second segment of the protective material during the etch. Storage elements are formed over the first upwardly-projecting structures and over the second upwardly-projecting structure. Each of the storage elements is uniquely addressed by said one of the first conductive lines and by a pair of the second conductive lines.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming an integrated assembly, comprising:

patterning a semiconductor material into a configuration which includes, along a cross-section, a set of first upwardly-projecting structures spaced from one another by first gaps and a second upwardly-projecting structure spaced from the set by a second gap; one of the first upwardly-projecting structures being an edge upwardly-projecting structure of the set and being adjacent the second gap; the second gap being larger than the first gaps;

forming conductive material along the first and second upwardly-projecting structures and within the first and second gaps;

forming protective material across the first gaps and within the second gap;

removing the protective material from over the first and second upwardly-projecting structures while leaving segments of the protective material over the conductive material within the second gap; one of the segments of the protective material being a first segment and being adjacent a sidewall of the edge upwardly-projecting structure, and one of the segments of the protective material being a second segment and being adjacent a sidewall of the second upwardly-projecting structure; and utilizing an etch to pattern the conductive material into first conductive structures within the first gaps and into second conductive structures within the second gap; one of the second conductive structures being adjacent the sidewall of the edge upwardly-projecting structure and being protected by the first segment of the protective material during the etch; another of the second conductive structures being adjacent the sidewall of the second upwardly-projecting structure and being protected by the second segment of the protective material during the etch.

2. The method of claim 1 wherein the protective material comprises silicon dioxide.

3. The method of claim 1 wherein the protective material comprises one or more high-k compositions.

4. The method of claim 1 wherein the semiconductor material comprises silicon.

5. The method of claim 1 further comprising forming a conductive interconnect to extend into the second gap and to between said one of the second conductive structures and said other of the conductive structures.

6. The method of claim 1 wherein the second conductive structures are shaped differently than the first conductive structures along the cross-section.

7. The method of claim 6 wherein the first conductive structures are substantially straight structures along the cross-section, and wherein the second conductive structures are angle plates along the cross-section.

8. A method of forming an integrated assembly, comprising:

forming a semiconductor material over a first series of first conductive lines;

patterning the semiconductor material into a configuration which includes, along a cross-section, a set of first upwardly-projecting structures over one of the first conductive lines and spaced from one another by first gaps and a second upwardly-projecting structure over said one of the first conductive lines and spaced from the set by a second gap; one of the first upwardly-projecting structures being an edge upwardly-projecting structure of the set and being adjacent the second gap; the second gap being larger than the first gaps;

forming conductive material along the first and second upwardly-projecting structures and within the first and second gaps;

forming protective material across the first gaps and within the second gap;

removing the protective material from over the first and second upwardly-projecting structures while leaving segments of the protective material over the conductive material within the second gap; one of the segments of the protective material being a first segment and being adjacent a sidewall of the edge upwardly-projecting structure, and one of the segments of the protective material being a second segment and being adjacent a sidewall of the second upwardly-projecting structure;

utilizing an etch to pattern the conductive material into a second series of second conductive lines; the second series including a first set of the second conductive lines within the first gaps, and a second set of the second conductive lines within the second gap; one of the second conductive lines of the second set being adjacent the sidewall of the edge upwardly-projecting structure and being protected by the first segment of the protective material during the etch; another of the second conductive lines of the second set being adjacent the sidewall of the second upwardly-projecting structure and being protected by the second segment of the protective material during the etch; and forming storage elements over the first upwardly-projecting structures and over the second upwardly-projecting structure; each of the storage elements being uniquely addressed by said one of the first conductive lines and by a pair of the second conductive lines.

9. The method of claim 8 wherein the semiconductor material includes one or more of silicon, germanium, III/V semiconductor material, and semiconductor oxide.

10. The method of claim 8 wherein the semiconductor material includes monocrystalline silicon.

11. The method of claim 8 wherein the storage elements are capacitors.

12. The method of claim 8 wherein the storage elements are ferroelectric capacitors.

13. The method of claim 8 wherein the second conductive structures are shaped differently than the first conductive structures along the cross-section.

14. The method of claim 13 wherein the first conductive structures are substantially straight structures along the cross-section, and wherein the second conductive structures are angle plates along the cross-section.

* * * * *